(12) United States Patent
Dziuba et al.

(10) Patent No.: US 9,917,530 B2
(45) Date of Patent: Mar. 13, 2018

(54) RECONFIGURABLE CONVERTER

(71) Applicant: Cummins Power Generation IP, Inc., Minneapolis, MN (US)

(72) Inventors: Robert Dziuba, Columbus, IN (US); Filip Stepancik, Waukesha, WI (US); Jaroslaw Leonarski, Columbus, IN (US); Yefrem I. Pekar, Carmel, IN (US)

(73) Assignee: Cummins Power Generation IP, Inc., Minneapolis, MN (US)

( * ) Notice: Subject to any disclaimer, the term of this patent is extended or adjusted under 35 U.S.C. 154(b) by 0 days.

(21) Appl. No.: 15/285,273

(22) Filed: Oct. 4, 2016

(65) Prior Publication Data
US 2017/0099010 A1  Apr. 6, 2017

Related U.S. Application Data

(60) Provisional application No. 62/237,913, filed on Oct. 6, 2015.

(51) Int. Cl.
*H02P 25/08* (2016.01)
*H02M 7/00* (2006.01)
*H02P 25/092* (2016.01)
*H02M 1/088* (2006.01)
*H02M 7/537* (2006.01)
*H02M 1/00* (2006.01)

(52) U.S. Cl.
CPC ............ *H02M 7/003* (2013.01); *H02M 1/088* (2013.01); *H02M 7/537* (2013.01); *H02P 25/092* (2016.02); *H02M 2001/0009* (2013.01)

(58) Field of Classification Search
CPC ............. H02M 3/07; H02M 2003/075; H02M 2001/0025; H02M 3/156; H02J 7/0027
See application file for complete search history.

(56) References Cited

U.S. PATENT DOCUMENTS

| 7,057,376 B2 | 6/2006 | Cook et al. |
| 7,502,242 B2 | 3/2009 | Iida |
| 7,564,147 B2 | 7/2009 | Michalko |
| 7,733,670 B2 | 6/2010 | Feng et al. |
| 8,238,130 B2 | 8/2012 | Wiegman et al. |
| 8,362,648 B2 | 1/2013 | Matsui et al. |

(Continued)

OTHER PUBLICATIONS

International Search Report and Written Opinion for PCT Patent Application No. PCT/US2016/055342, dated Dec. 15, 2016, 13 pages.

*Primary Examiner* — Shawki S Ismail
*Assistant Examiner* — Zoheb Imtiaz
(74) *Attorney, Agent, or Firm* — Foley & Lardner LLP

(57) ABSTRACT

A reconfigurable converter includes a power circuit receives a direct current (DC) power signal and provides an alternating current (AC) output signal across at least three phases. The power circuit comprises a plurality of legs, each leg comprising an output node. A coupling device provides a first output configuration and a second output configuration for the plurality of legs. In the first output configuration, the coupling device comprises a coupling portion coupling at least two output nodes to provide a common output terminal. In the second output configuration, the coupling device comprises separate output terminals, each connected to one of the at least two output nodes.

23 Claims, 11 Drawing Sheets

(56) References Cited

U.S. PATENT DOCUMENTS

| | | | |
|---|---|---|---|
| 8,934,268 B2 | 1/2015 | Trainer et al. | |
| 9,479,061 B2 * | 10/2016 | Trainer | H02M 3/335 |
| 2006/0152085 A1 * | 7/2006 | Flett | B60L 9/30 |
| | | | 307/75 |
| 2008/0308292 A1 * | 12/2008 | Okushita | H02G 5/02 |
| | | | 174/68.2 |
| 2011/0227408 A1 * | 9/2011 | Peterson | B60L 11/123 |
| | | | 307/9.1 |

* cited by examiner

(12) United States Patent
US 9,917,530 B2

RECONFIGURABLE CONVERTER

This application claims priority to and the benefit of U.S. Provisional Patent Application No. 62/237,913, filed Oct. 6, 2015, entitled "Reconfigurable Converter," which is incorporated herein by reference in its entirety.

TECHNICAL FIELD

The present disclosure relates generally to a power electronics converter. More particularly, the present disclosure relates to a power electronics converter that can be reconfigured for various applications.

BACKGROUND

Converters perform a number of different functions in vehicle applications and power conversion, such as traction inverters for multi-phase (e.g., three-phase, four-phase, etc.) electrical machines including, for example, permanent magnet motors, induction motors and switched reluctance motors, battery chargers, air compressors, power steering systems, high efficiency alternators, AC power output to an electrical load or power grid from an inverter, heat, ventilation and air conditioning systems (HVAC), electrical fans, etc. Traditionally, separate, fixed converters are used for different functions and configurations. Such converters include no option for reconfiguration of the converter for multiple units.

SUMMARY

One embodiment of the present disclosure relates to a reconfigurable converter or inverter. The reconfigurable converter includes a first rail, a second rail, a plurality of legs connected in parallel between the first rail and the second rail, and at least one coupling device. The first rail and the second rail transmit a direct current (DC) power signal. Each of the plurality of legs includes a first switch and a second switch. The first switch and the second switch are connected in series between the first rail and the second rail. An output node is between the first switch and the second switch. The at least one coupling device provides a first output configuration and a second output configuration for at least two output nodes on the plurality of legs. In the first output configuration, the at least one coupling device comprises a coupling portion coupling the at least two output nodes to provide a common output terminal. In the second output configuration, the at least one coupling device comprises separate output terminals, each connected to one of the at least two output nodes.

Another embodiment relates to a converter system. In the converter system, the at least one coupling device comprises bus bars. The bus bars provide a first output configuration and a second output configuration for at least two output nodes on the plurality of legs. In the first configuration, the bus bars comprise a first bus bar coupling the at least two output nodes to provide a common output terminal. In the second output configuration, the bus bars comprise second bus bars, each connected to one of the at least two output nodes to provide separate output terminals. In some embodiments, the first bus bar is a T-shape bus bar. In some embodiments, the first bar is a U-shaped bus bar. In some embodiments, the first bus bar is a multi-tooth fork bar. The second bus bars are straight bus bars.

Still another embodiment relates to a reconfigurable converter. The converter comprises a power circuit and at least one coupling device. The power circuit receives a direct current (DC) power signal and provides an alternating current (AC) output signal across at least three phases. The power circuit comprises a plurality of legs, each leg comprising an output node. The at least one coupling device provides a first output configuration and a second output configuration for at least two output nodes on the plurality of legs. In the first output configuration, the at least one coupling device comprises a coupling portion coupling the at least two output nodes to provide a common output terminal. In the second output configuration, the at least one coupling device comprises separate output terminals, each connected to one of the at least two output nodes.

These and other features, together with the organization and manner of operation thereof, will become apparent from the following detailed description when taken in conjunction with the accompanying drawings.

DETAILED DESCRIPTION OF VARIOUS EMBODIMENTS

Figure 1:
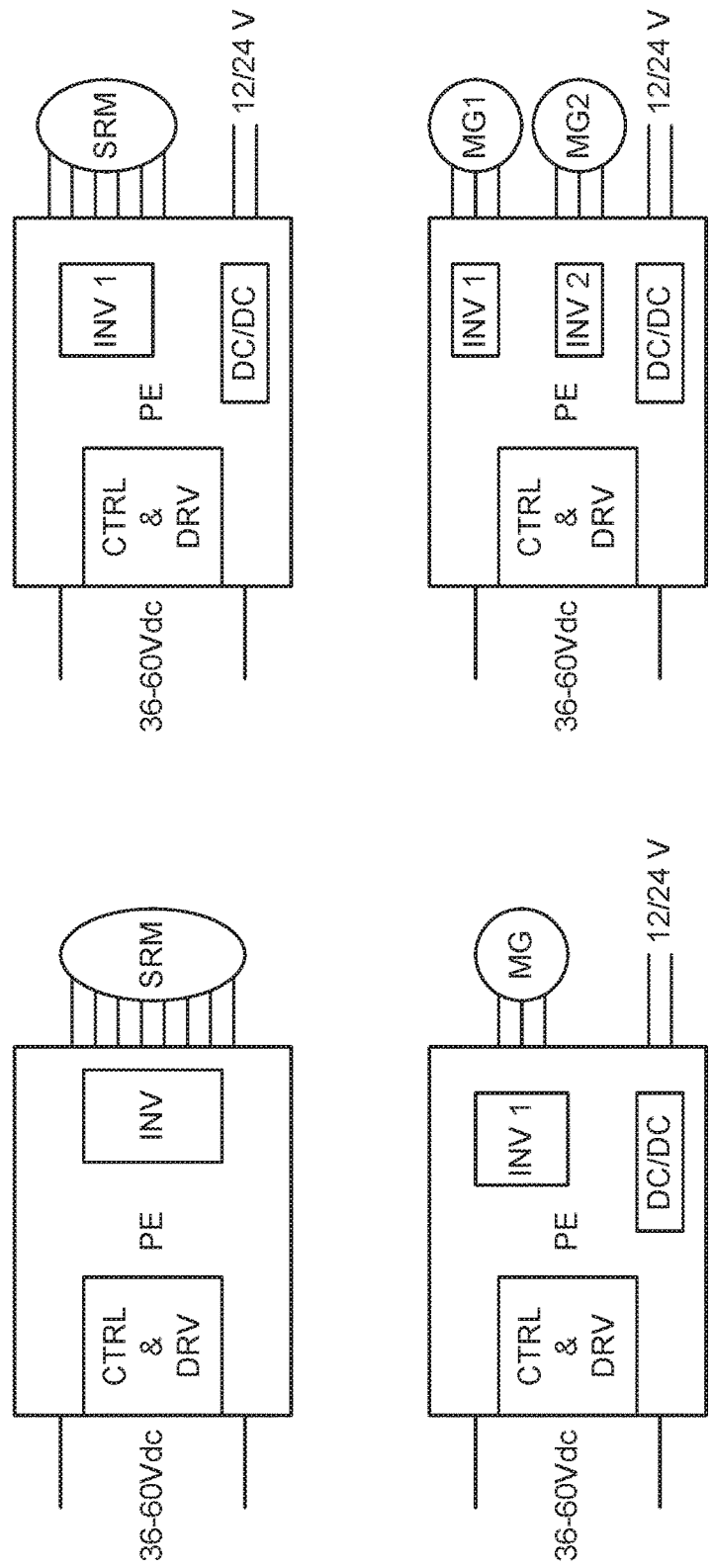
FIG. 1 is block diagrams illustrating an exemplary reconfigurable converter working under different configurations.

Referring to the Figures generally, the various embodiments disclosed herein relate to reconfigurable power electronics converters and inverters. In vehicle applications, a number of different functions are performed by converters with different configurations. For example, traction inverters are used for three-phase electrical machines such as permanent magnet motors or induction motors, and three-phase or four-phase switched reluctance motors. Power inverter applications provide one, two, or three phase output from a DC source or variable speed generator to provide power for electrical loads or paralleled to a utility grid. Other converters are used for battery chargers, drives for air compressors, or power steering systems, high efficiency alternators, heat, ventilation and air conditioning systems (HVAC), electrical fans, etc. Traditionally, separate, fixed converters are used for these different functions. Such converters and inverters include no option for reconfiguration of the converter for multiple units.

A reconfigurable power electronic converter or inverter according to various embodiments provides a solution integrating the functions performed by different converters for different vehicle applications. With reconfiguration of few components while the rest of the converter remains unchanged, the reconfigurable converter allows for use as multiple-phase inverters, DC/DC converters, and the combination of both. The reconfigurable converter includes internal paralleling converter legs and integrates multiple separate inverters and DC/DC converters within the same box, thereby providing a vehicle electrification or AC power output solution that can leverage volume factors and reduce the total system cost.

The reconfigurable converter may be used in conjunction with a generator set (genset). For example, the reconfigurable converter receives input power from the genset which includes an engine (e.g., a synchronous or variable speed engine) coupled to an alternator/generator. According to some implementations, the engine is configured to drive the alternator which, in turn, outputs electrical power (e.g., a three-phase AC power). The three-phase AC power is provided to a rectifier which converts the AC power to a DC output and provides the DC output to the reconfigurable converter. Alternatively, DC output can be provided to the reconfigurable converter or inverter from a storage device or battery, fuel cell, or a renewable source, such as wind or solar. The output of the reconfigurable converter may include AC power and/or DC power. The output AC power may be utilized to drive an electrical load, such as an electric motor, for example, in a hybrid vehicle powertrain, or provide power to a local grid connection in a paralleled manner. The AC power may also be utilized to drive air compressors, power steering systems, alternators, HVAC, electrical fans, etc. The output DC power may be utilized for battery chargers, power converters, or for paralleling with other inverters to a common output.

Referring now to FIG. 1, an embodiment of a reconfigurable converter working under different configurations is shown. Under one configuration, the reconfigurable converter is configured to drive a four-phase switched reluctance machine. Under another configuration, the reconfigurable converter is configured to drive a three-phase switched reluctance machine or a three-phase electrical load or grid and to provide a DC/DC conversion output. Under yet another configuration, the reconfigurable converter is configured to drive dual three-phase permanent magnet/induction motors and to provide a DC/DC conversion output. Under another configuration, the reconfigurable converter is configured to drive a three-phase permanent magnet/induction motor and to provide a DC/DC conversion output. It shall be appreciated that the input voltage and output voltage are provided for purpose of illustrations only. The input voltage and the output voltage may vary depending on the applications. It shall also be appreciated that the configurations shown in FIG. 1 are provided for purposes of illustration only. Other embodiments may include fewer, more, or different configurations than those illustrated in FIG. 1.

With reference to FIGS. 2(a)-2(d), schematic circuit diagrams of a reconfigurable converter under different configurations are shown according to an embodiment. In configuration 201, the converter is configured to drive a four-phase switched reluctance machine. In configuration 202, the converter is configured to drive a three-phase switched reluctance machine and to provide two DC/DC conversion outputs. In configuration 203, the converter is configured to drive dual three-phase induction or permanent magnet motors and to provide an interleaved DC/DC conversion output. In configuration 204, the converter is configured to drive a three-phase induction or permanent magnet motor and to provide an interleaved DC/DC conversion output.

A DC voltage is applied across a first rail 211 and a second rail 212. The first rail 211 and the second rail 212 may be connected to an output of a genset (not shown in the present figures). The genset includes an engine (e.g., a variable speed engine) coupled to an alternator. The engine is configured to drive the alternator which, in turn, outputs a three-phase AC power. The three-phase AC power is provided to a rectifier which converts the AC power to a DC output and provides the DC output across the first rail 211 and the second rail 212. It is noted that the genset and resulting AC signal may be variable speed or synchronous speed, and that a storage element or renewable power source, such as a battery or super capacitors or photovoltaics or wind source may also be coupled to the DC output across the first rail 211 and the second rail 212 in some embodiments. In some implementations, the input DC can be a low voltage, for example, in a range of about 36 volts DC (Vdc) to about 60 Vdc. The low voltage converter can be used in low cost hybrid systems. In some implementations, the input voltage can be a higher voltage, for example, 300-400 Vdc. It shall be appreciated that the particular voltage of the input may vary depending on the needs of the load being driven. It shall also be appreciated that the aforementioned nominal voltages are not limiting.

In the illustrated embodiment, the converter includes a first leg 221, a second leg 222, a third leg 223, a fourth leg 224, a fifth leg 225, a sixth leg 226, a seventh leg 227, and an eighth leg 228 connected in parallel between first rail 211 and second rail 212. It shall be appreciated that the number of legs may vary depending on the applications. First leg 221 includes a first switch 221Q1 and a second switch 221Q2 connected in series between first rail 211 and second rail 212. In the illustrated embodiment, the switches are metal oxide semiconductor field effect transistor (MOSFET) switches. It shall be appreciated that a variety of other switches are contemplated in connection with the converter as well as the system described herein including, for example, insulated gate bipolar transistor (IGBT) switches, as well as a variety of other devices. Each of first switch 221Q1 and second switch 221Q2 can include one or more switching elements. The switches are configured to receive control signals from one or more control modules (not illustrated in the present figure) effective to turn the switches on or off, in some embodiments. First leg 221 further includes an output node 221n between first switch 221Q1 and second switch 221Q2.

Second leg 222 includes a first switch 222Q1 and a second switch 222Q2 connected in series between first rail 211 and second rail 212. Second leg 222 further includes an output node 222n between first switch 222Q1 and second switch 222Q2. Third leg 223 includes a first switch 223Q1 and a second switch 223Q2 connected in series between first rail 211 and second rail 212 and an output node 223n between first switch 223Q1 and second switch 223Q2. Fourth leg 224 includes a first switch 224Q1 and a second switch 224Q2 connected in series between first rail 211 and second rail 212 and an output node 224n between first switch 224Q1 and second switch 224Q2. Fifth leg 225 includes a first switch 225Q1 and a second switch 225Q2 connected in series between first rail 211 and second rail 212 and an output node 225n between first switch 225Q1 and second switch 225Q2. Sixth leg 226 includes a first switch 226Q1 and a second switch 226Q2 connected in series between first rail 211 and second rail 212 and an output node 226n between first switch 226Q1 and second switch 226Q2. Seventh leg 227 includes a first switch 227Q1 and a second switch 227Q2 connected in series between first rail 211 and second rail 212 and an output node 227n between first switch 227Q1 and second switch 227Q2. Eighth leg 228 includes a first switch 228Q1 and a second switch 228Q2 connected in series between first rail 211 and second rail 212 and an output node 228n between first switch 228Q1 and second switch 228Q2.

The configurations shown in FIGS. 2(a) through 2(d) are provided for purposes of illustration only. It shall be appreciated that other embodiments may include, fewer, more, or different components than those illustrated in FIGS. 2(a) through 2(d), and such components may be connected in the same or different configurations. All such modifications are contemplated within the scope of the present disclosure.

In configuration 201, the converter is configured to drive a four-phase switched reluctance machine 231. An output terminal 241 from node 221n of first leg 221 and an output terminal 242 from node 222n of second leg 222 are coupled to a first phase winding (not illustrated in the present figure) of four-phase switched reluctance machine 231 and drives a first phase to the machine. An output terminal 243 from node 223n of third leg 223 and an output terminal 244 from node 224n of fourth leg 224 are coupled to a second phase winding (not illustrated in the present figure) of four-phase switched reluctance machine 231 and drives a second phase to the machine. An output terminal 245 from node 225n of fifth leg 225 and an output terminal 246 from node 226n of sixth leg 226 are coupled to a third phase winding (not illustrated in the present figure) of four-phase switched reluctance machine 231 and drives a third phase to the machine. An output terminal 247 from node 227n of seventh leg 227 and an output terminal 248 from node 228n of eighth leg 228 are coupled to a fourth phase winding (not illustrated in the present figure) of four-phase switched reluctance machine 231 and drives a fourth phase to the machine. The four-phase switch reluctance machine 231 may be utilized, for example, in a hybrid electric vehicle or a recreational vehicle.

In configuration 201, four-phase switched reluctance machine 231 receives four respective phases, one from every two legs. In some embodiments, the phase in each leg is generated by a control module (not illustrated in the present figure). The control module can be responsible for giving the sequential pulses to the switches of each leg in order to activate the phase. The control module, for example, may be a pulse width modulation (PWM) control circuit. It shall be appreciated that the control module may be configured and implemented as software (e.g., firmware), hardware, or combination thereof. It shall also be appreciated that the control module may be implemented in individual control units or distributed among multiple control units, and may be implemented in digital control or analogy circuitry.

In configuration 202, the converter is configured to drive a three-phase switched reluctance machine 232 and to include two optional DC/DC converters. Output terminal 241 from node 221n of first leg 221 and output terminal 242 from node 222 of second leg 222 are coupled to a first phase winding (not illustrated in the present figure) of three-phase switched reluctance machine 232 and drives a first phase to the machine. Output terminal 243 from node 223n of third leg 223 and output terminal 244 from node 224n of fourth leg 224 are coupled to a second phase winding (not illustrated in the present figure) of three-phase switched reluctance machine 232 and drives a second phase to the machine. Output terminal 245 from node 225n of fifth leg 225 and output terminal 246 from node 226n of sixth leg 226 are coupled to a third phase winding (not illustrated in the present figure) of three-phase switched reluctance machine 232 and drives a third phase to the machine. The three-phase switch reluctance machine 232 may be utilized, for example, in a hybrid electric vehicle or a recreational vehicle.

In configuration 202, three-phase switched reluctance machine 232 receives three respective phases. In some embodiments, the phase in each leg is generated by a control module (not illustrated in the present figure). The control module can be responsible for giving the sequential pulses to the switches of each leg in order to activate the phase. The control module, for example, may be a pulse width modulation (PWM) control circuit. It shall be appreciated that the control module may be configured and implemented as software (e.g., firmware), hardware, or combination thereof. It shall also be appreciated that the control module may be implemented in individual control units or distributed among multiple control units, and may be implemented in digital control or analogy circuitry.

In some embodiments, seventh leg 227 and eighth leg 228 may optionally be configured to provide two DC/DC conversion outputs. For example, seventh leg 227 and eighth leg 228 may be configured to provide step-down voltages, such that the input voltage is reduced to predetermined lower output voltages (e.g., control voltages). Output terminal 247 from node 227n of seventh leg 227 and output terminal 248 from node 228n of eighth leg 228 may provide two output DC voltages. In an embodiment, one output is 24 Vdc, the other output is 12 Vdc. In some embodiments, the output DC voltage levels are controlled by a feedback control system or have optional filter elements (inductors and/or capacitors) coupled to the output to smooth out the DC voltage output. It shall be appreciated that the output voltages may vary depending on the load being driven and that during operation the nominal voltage provided by an output may increase or decrease such as may occur due to voltage control command or load fluctuation including, for example, the state of charge vehicle batteries. The output DC power may be utilized for battery charges, power converters, or for paralleling with other inverters to a common output.

In configuration 203, the converter is configured to drive dual three-phase motors 233 and 234 or provide two three-phase (with each phase coming from a separate leg, as with the three-phase motor), or two two-phase (with each phase provided by a separate converter leg and a neutral provided by a third leg), or six single-phase AC voltage outputs (each phase provided by a single output leg), and to include an optional DC/DC converter. In the illustrated embodiment, output terminal 241 from node 221n is coupled to a first phase winding (not illustrated in the present figure) of three-phase motor 133 and drives a first phase to the motor (the motor may be in either a delta or "Y" configuration). Output terminal 242 from node 222n is coupled to a second phase winding (not illustrated in the present figure) of three-phase motor 233 and drives a second phase to the motor. Output terminal 243 from node 223n is coupled to a third phase winding (not illustrated in the present figure) of three-phase motor 233 and drives a third phase to the motor. In this manner, three-phase motor 233 receives three respective phases. Output terminal 244 from node 224*n* is coupled to a first phase winding (not illustrated in the present figure) of three-phase motor 234 and drives a first phase to the motor. Output terminal 245 from node 225*n* is coupled to a second phase winding (not illustrated in the present figure) of three-phase motor 234 and drives a second phase to the motor. Output terminal 246 from node 226*n* is coupled to a third phase winding (not illustrated in the present figure) of three-phase motor 234 and drives a third phase to the motor.

In configuration 203, three-phase motor 234 receives three respective phases. Three-phase motors 133 and 134 may each be an induction or a permanent magnet motor. In some embodiments, the phase in each leg is generated by a control module (not illustrated in the present figure). The control module can be responsible for giving the sequential pulses to the switches of each leg in order to activate the phase. The control module, for example, may be a pulse width modulation (PWM) control circuit. It shall be appreciated that the control module may be configured and implemented as software (e.g., firmware), hardware, or combination thereof. It shall also be appreciated that the control module may be implemented in individual control units or distributed among multiple control units, and may be implemented in digital control or analogy circuitry.

In some embodiments, seventh leg 227 and eighth leg 228 may optionally be configured to provide an interleaved DC/DC conversion output. For example, seventh leg 227 and eighth leg 228 may be configured to provide a step-down voltage, such that the input voltage is reduced to a predetermined lower output voltage (e.g., a control voltage). Output terminal 247 from node 227*n* of seventh leg 227 and output terminal 248 from node 228*n* of eight leg 228 may provide an output DC voltage. In an embodiment, the output is 24 Vdc. In another embodiment, the output is 12 Vdc. In some embodiments, the output DC voltage levels are controlled by a feedback control system or have optional filter elements (inductors and/or capacitors) coupled to the output to smooth out the DC voltage output. It shall be appreciated that the output voltages may vary depending on the load being driven and that during operation the nominal voltage provided by an output may increase or decrease such as may occur due to voltage control command or load fluctuation including, for example, the state of charge vehicle batteries.

In configuration 204, the converter is configured to drive a three-phase induction or permanent magnet motor in a push-pull configuration and to include an optional DC/DC converter. Output nodes 221*n* of first leg 221 and 222*n* of second leg 222 are coupled to provide a common output terminal 241*c*. Output nodes 223*n* of third leg 223 and 224*n* of fourth leg 224 are coupled to provide a common output terminal 242*c*. Output nodes 225*n* of fifth leg 225 and 226*n* of sixth leg 226 are coupled to provide a common output terminal 243*c*. Output terminal 241*c* drives a first phase to a three-phase motor 235. Output terminal 242*c* drives a second phase to three-phase motor 235. Output terminal 243*c* drives a third phase to three-phase motor 235. In this manner, three-phase motor 235 receives three respective phases. Three phase motor 235 may be an induction or a permanent magnet motor. In some embodiments, the phase in each leg is generated by a control module (not illustrated in the present figure). The control module can be responsible for giving the sequential pulses to the switches of each leg in order to activate the phase. The control module, for example, may be a pulse width modulation (PWM) control circuit. It shall be appreciated that the control module may be configured and implemented as software (e.g., firmware), hardware, or combination thereof. It shall also be appreciated that the control module may be implemented in individual control units or distributed among multiple control units, and may be implemented in digital control or analogy circuitry.

In some embodiments, seventh leg 227 and eighth leg 228 may optionally be configured to provide an interleaved DC/DC conversion output. For example, seventh leg 227 and eighth leg 228 may be configured to provide a step-down voltage, such that the input voltage is reduced to a predetermined lower output voltage (e.g., a control voltage). Output terminal 247 from node 227*n* of seventh leg 227 and output terminal 248 from node 228*n* of eighth leg 228 may provide an output DC voltage. In an embodiment, the output is 24 Vdc. In another embodiment, the output is 12 Vdc. In some embodiments, the output DC voltage levels are controlled by a feedback control system. It shall be appreciated that the output voltages may vary depending on the load being driven and that during operation the nominal voltage provided by an output may increase or decrease such as may occur due to voltage control command and load fluctuation including, for example, the state of charge vehicle batteries.

Figure 2A:
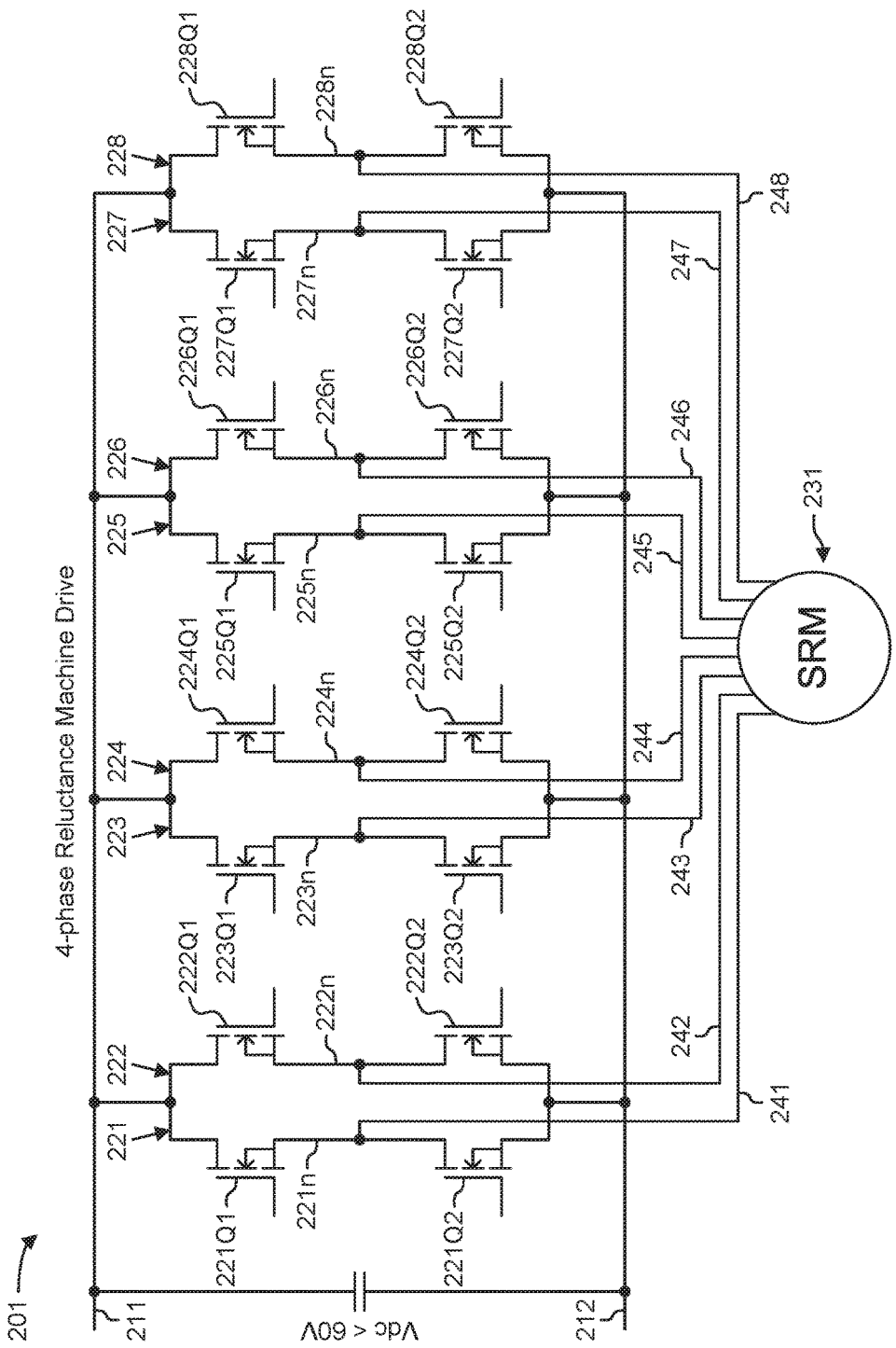
FIG. 2(a) is a schematic diagram of a circuit configuration in which a reconfigurable converter is configured to drive a four-phase switched reluctance machine.
Figure 2B:
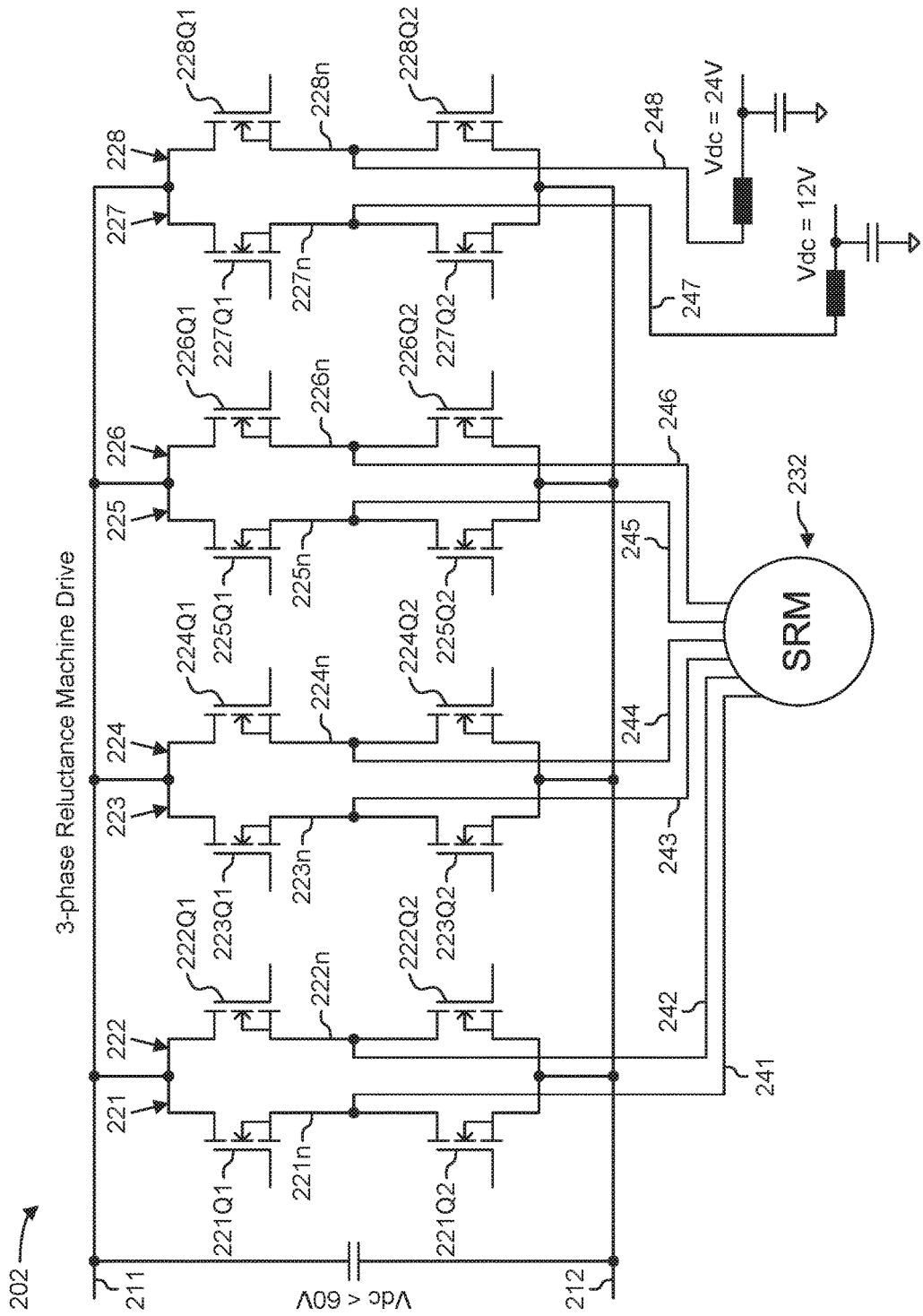
FIG. 2(b) is a schematic diagram of a circuit configuration in which a reconfigurable converter is configured to drive a three-phase switched reluctance machine and to provide two DC/DC conversion outputs.
Figure 2C:
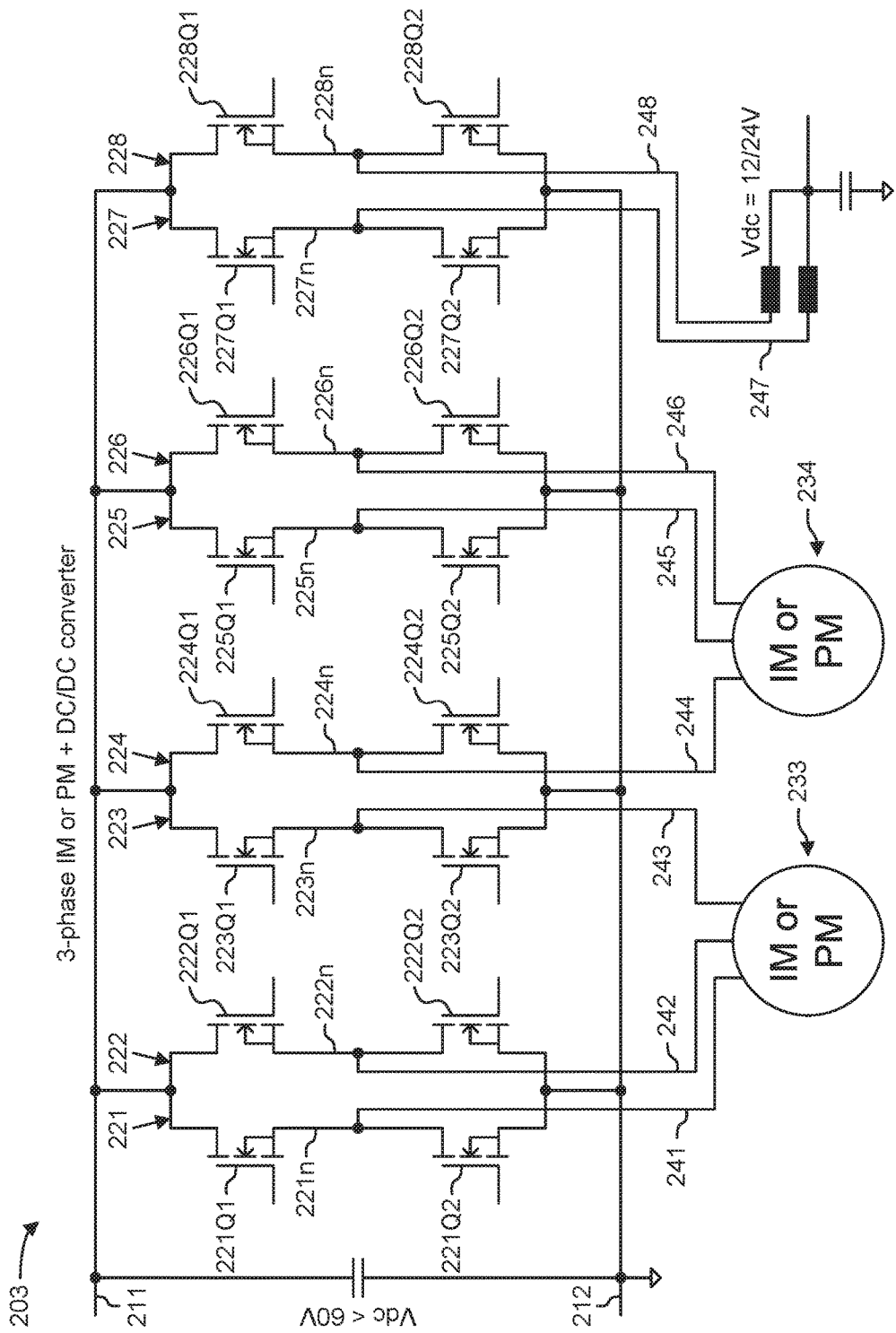
FIG. 2(c) is a schematic diagram of a circuit configuration in which a reconfigurable converter is configured to drive dual three-phase permanent magnet/induction motors and to provide an interleaved DC/DC conversion output.
Figure 2D:
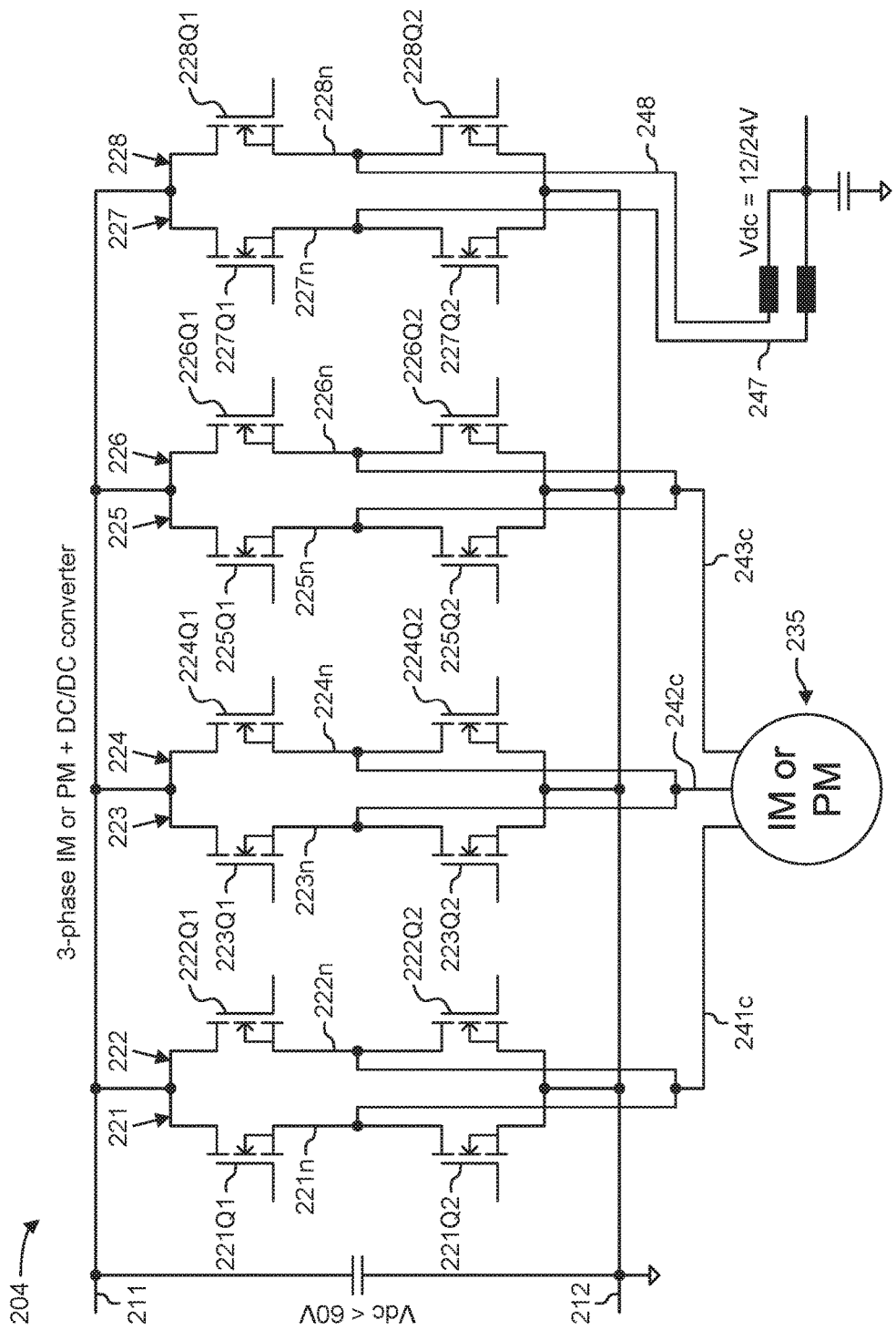
FIG. 2(d) is a schematic diagram of a circuit configuration in which a reconfigurable converter is configured to drive a three-phase permanent magnet/induction motor and to provide an interleaved DC/DC conversion output.
Figure 3:
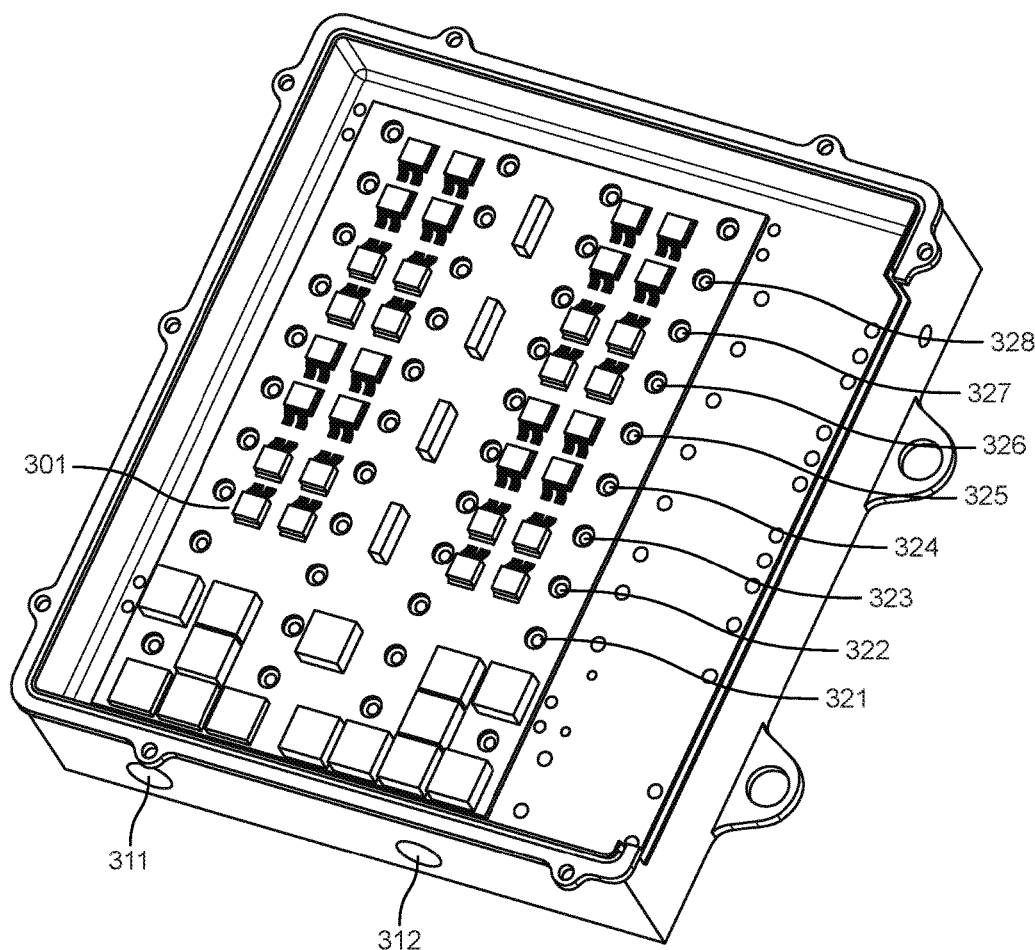
FIG. 3 is a perspective diagram illustrating a reconfigurable converter system in a box.

With reference to FIG. 3, a prospective diagram illustrating a reconfigurable converter system packaged in a box is shown according to an embodiment. In the illustrated embodiment, circuit illustrated in FIGS. 1(*a*)-1(*d*) is realized on a printed circuit board (PCB) 301. Input nodes 311 and 312 are configured to receive DC input from, for example, a genset (not shown in the present figures). The genset includes an engine (e.g., a variable or synchronous speed engine) coupled to an alternator. The engine is configured to drive the alternator which, in turn, outputs a variable or synchronous single-phase or three-phase AC power. The AC power is provided to a rectifier which converts the AC power to a DC output and provides the DC output to the input nodes 311 and 312. Nodes 321, 322, 323, 324, 325, 326, 327, and 328 on PCB 301 correspond to nodes 221, 222, 223, 224, 225, 226, 227, and 228 in FIGS. 2(*a*)-2(*d*), respectively, in one embodiment. It shall be appreciated that the dimensions of the box and the arrangement of the nodes are for illustration only. In some implementations, the box may be of different dimensions and the arrangement of the nodes may be different.

Figure 4:
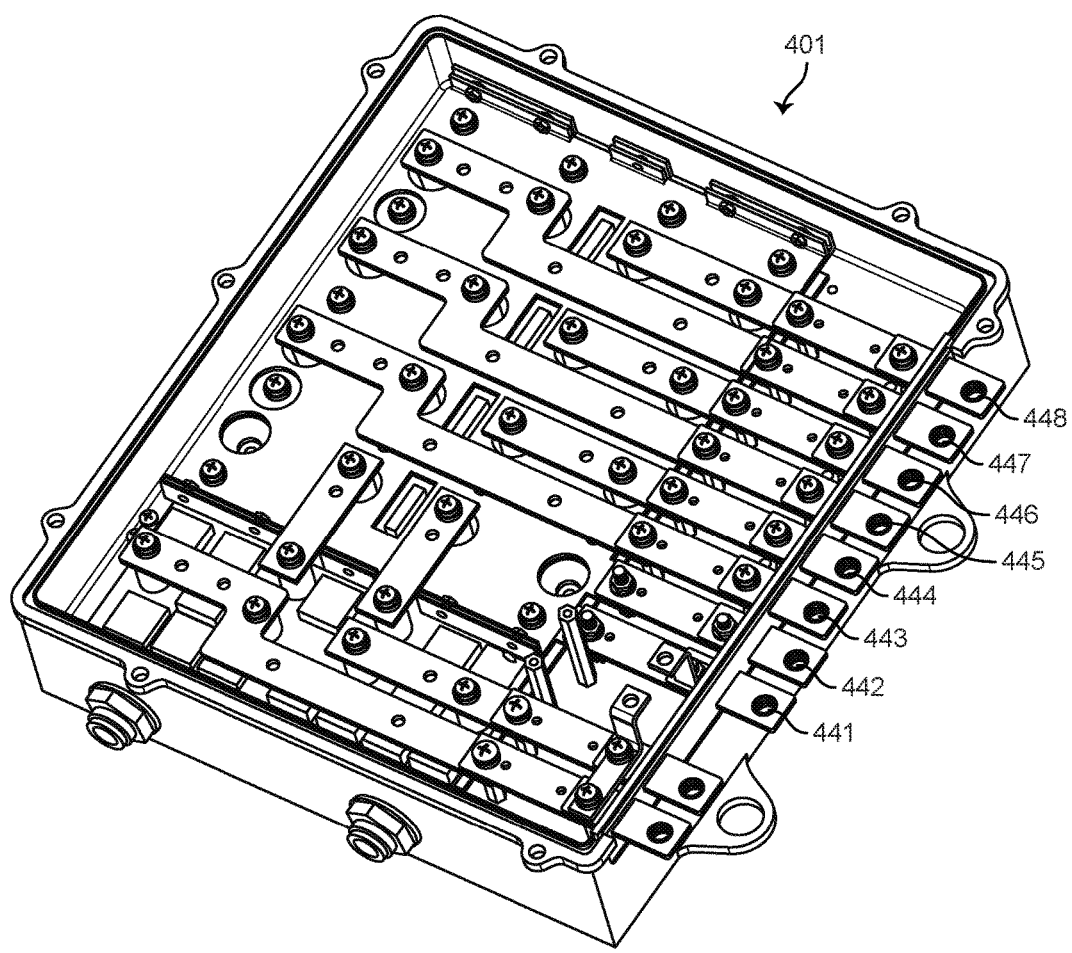
FIG. 4 is a perspective diagram of a reconfigurable converter in which straight bus bars provide output terminals for each output node.

With reference to FIG. 4, a reconfigurable converter 401 in which straight bus bars provide two output terminals for each converter leg is shown according to an embodiment. Straight bus bar 441 is connected to the output node of the first converter leg. Straight bus bar 442 is connected to the output node of the second converter leg. Straight bus bar 443 is connected to the output node of the third converter leg. Straight bus bar 444 is connected to the output node of the fourth converter leg. Straight bus bar 445 is connected to the output node of the fifth converter leg. Straight bus bar 446 is connected to the output node of the sixth converter leg. Straight bus bar 447 is connected to the output node of the seventh converter leg. Straight bus bar 448 is connected to the output node of the eighth converter leg. Under this configuration, converter 401 can be used to drive a four-phase switched reluctance machine, as illustrated in FIG. 2(*a*), or to drive a three-phase switched reluctance machine and to provide two DC/DC conversion outputs, as illustrated in FIG. 2(*b*), or drive dual three-phase motors or provide two three-phase, or two two-phase, or six single-phase AC voltage outputs and to provide a DC/DC conversion output, as illustrated in FIG. 2(*c*).

Figure 5:
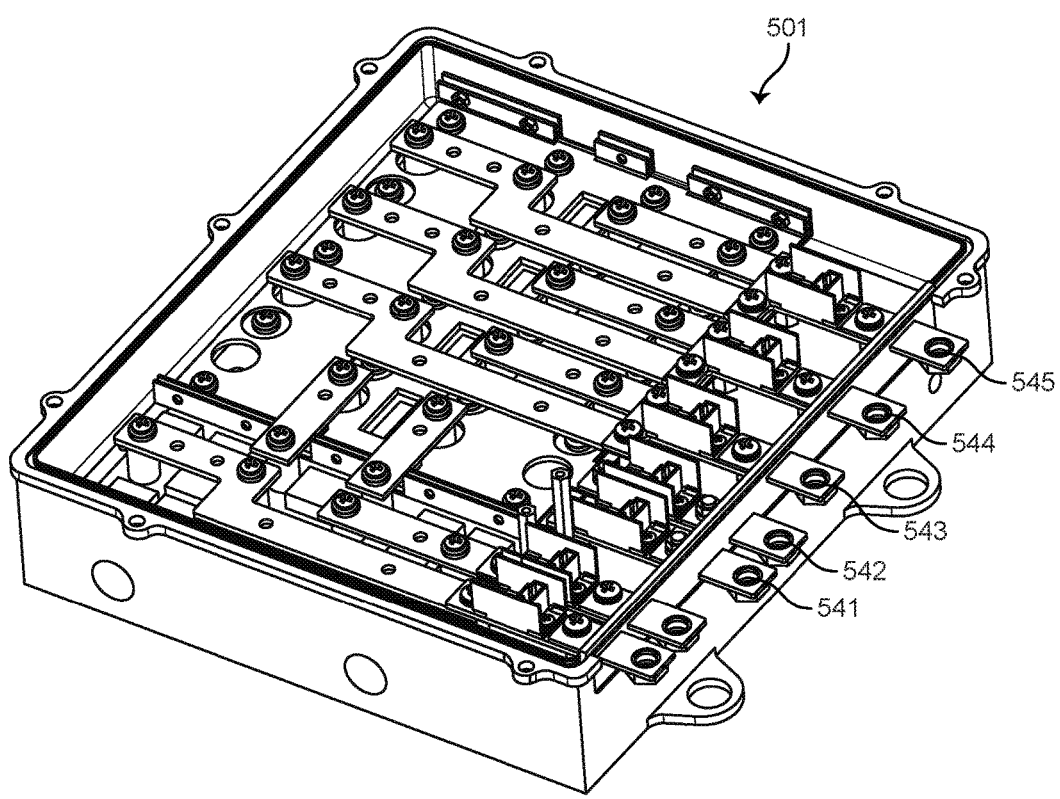
FIG. 5 is a perspective diagram of a reconfigurable converter in which straight bus bars provide separate output terminals and T-shape bus bars provide one output terminal for every two output nodes.

With reference to FIG. 5, a prospective diagram of a reconfigurable converter 501 in which straight bus bars each provide one output terminal for a converter leg and T-shape bus bars provide one output terminal for every two converter legs is shown according to an embodiment. Straight bus bar 541 is connected to the output node of the first converter leg. Straight bus bar 542 is connected to the output node of the second converter leg. T-shape bus bar 543 is connected to both output nodes of the third and the fourth converter legs and provides a common output terminal. T-shape bus bar 544 is connected to both output nodes of the fifth and the sixth converter legs and provides a common output terminal. T-shape bus bar 545 is connected to both output nodes of the seventh and the eighth converter leg and provides a common output terminal. Under this configuration, converter 501 can be used to drive a three-phase induction or permanent magnet motor, as illustrated in FIG. 2(d). In some embodiments, current sensors are attached on each of the straight bus bars and the T-shape bus bars. The on-bus bar current sensors can be seen more clearly in FIG. 6.

In the illustrated embodiment, straight bars and T-shape bars are connected to the nodes by bolts. When switching the configuration of the converter from FIG. 4 to FIG. 5, straight bus bars 443, 444, 445, 446, 447, and 448 are unscrewed from corresponding nodes. T-shape bus bars 543, 544, 545 are fastened to the nodes. When switching configuration of the converter from FIG. 5 to FIG. 4, T-shape bus bars 543, 544, 545 are unscrewed from corresponding nodes. Straight bus bars 443, 444, 445, 446, 447, and 448 are fastened to the nodes. It shall be appreciated that bolts are exemplary fasteners for illustration only. Other fastening devices may be used in other implementations.

Figure 6:
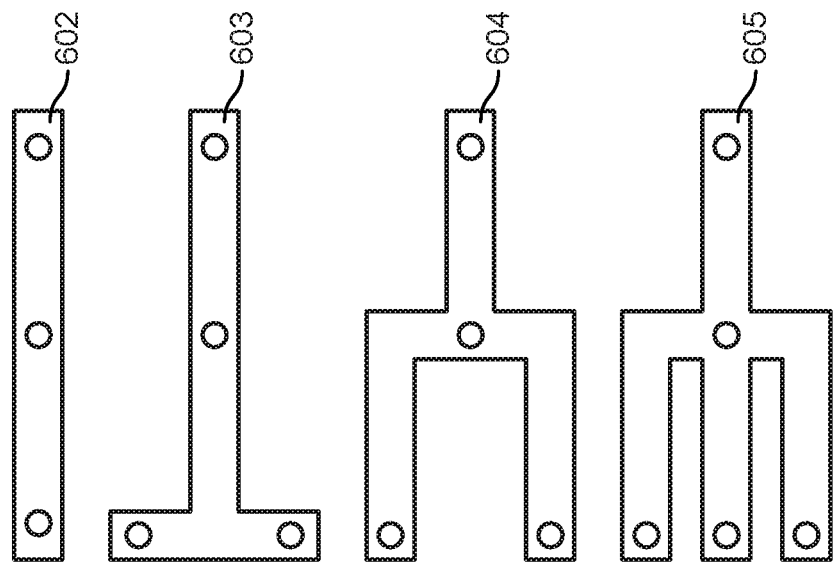
FIG. 6 is an exploded perspective diagram of a T-shape bus bar with an on-bus bar current sensor and schematic diagrams of a straight bus bar, a T-shape bus bar, a U-shape bus bar, and a multi-tooth fork bar.
Figure 6:
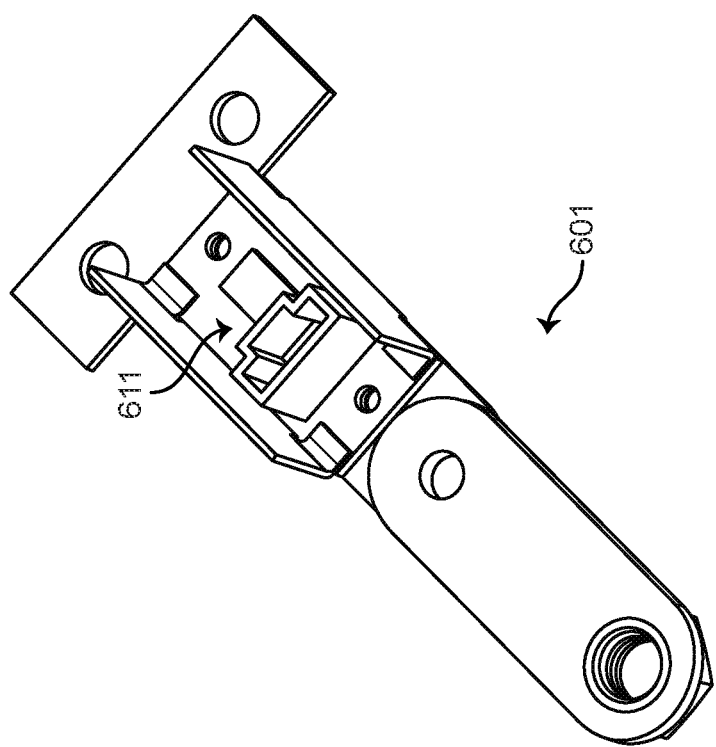

With reference to FIG. 6, an exploded prospective diagram of a T-shape bus bar 601 and schematic diagrams of a straight bus bar 602, a T-shape bus bar 603, a U-shape bus bar 604, and a multi-tooth fork bar 605 are shown according to embodiments. In some embodiments, the bars are made of copper by punching method. It shall be appreciated that the bars may be made of any conductive material by any appropriate processing. In some embodiments, a current sensor 611 is attached on the T-shape bus bar for sensing current passing on the bus bar. The straight bar 602 can provide an output terminal for one leg. The T-shape bus bar 603 or the U-shape bus bar 604 can be used to couple two output nodes of two legs to provide a common output terminal. The multi-tooth fork bar 605 with three teeth can be used to couple three output nodes of three legs to provide a common terminals, such as to provide increased current capacity by parallel operation, differential driving of permanent magnet or induction motors, or to provide multiple switch elements for advanced switching control or soft switching. In other embodiments, multi-tooth fork bars with different numbers of teeth can be used to couple any number of output nodes.

Figure 7:
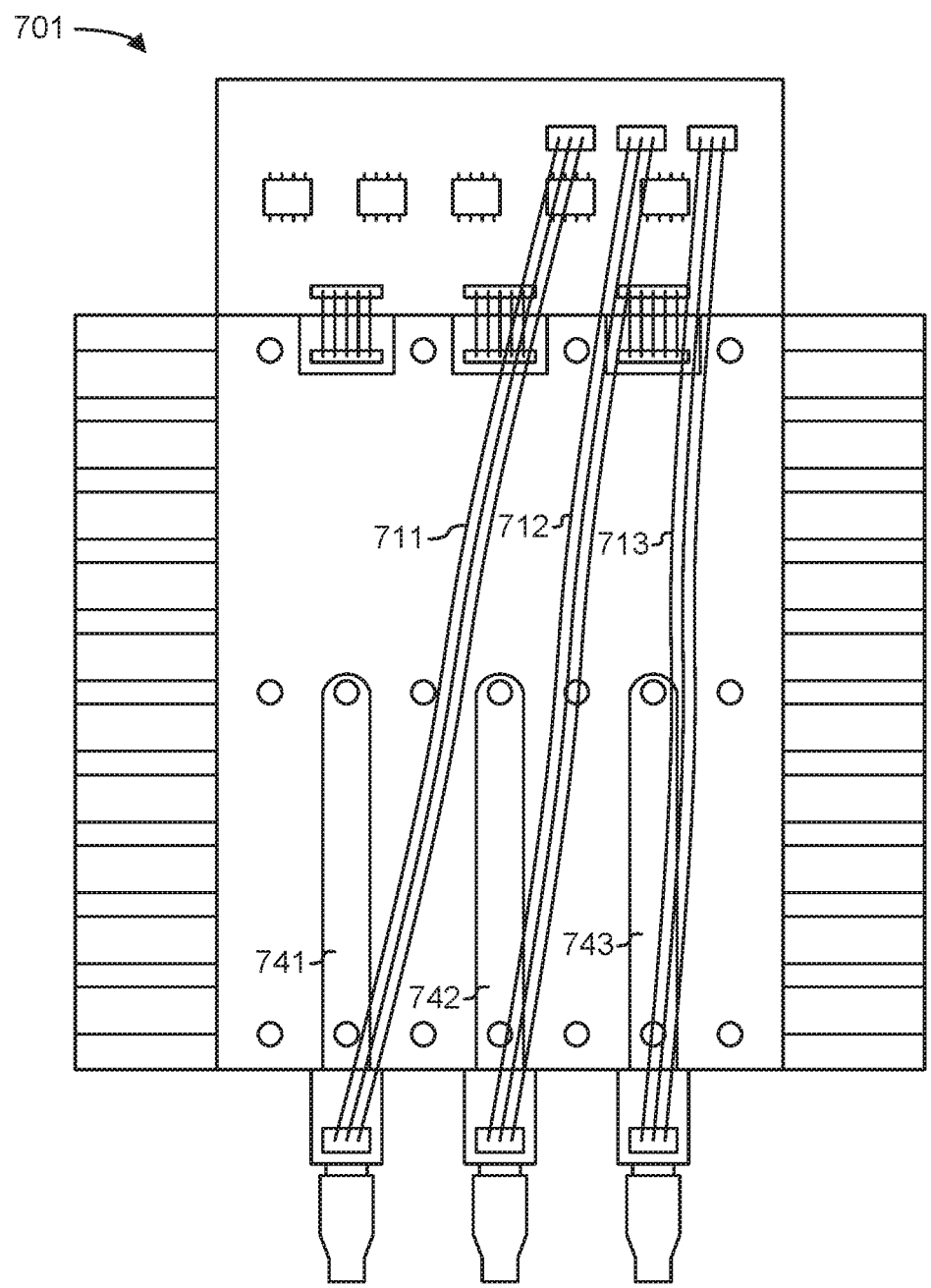
FIG. 7 is a top-view diagram of a three-leg converter system in which straight bus bars provide output terminals.

It should be noted that the bus bars as described above with reference to FIG. 6 can be used to implement various types of converters. FIG. 7 shows a top-view diagram of a three-leg converter system 701 in which straight bus bars are used to provide output terminals. Straight bus bar 741 is connected to the output node of the first converter leg. Straight bus bar 742 is connected to the output node of the second converter leg. Straight bus bar 743 is connected to the output node of the third converter leg. Under this configuration, the converter 701 can be used to provide, for example, a three-phase AC voltage output. As shown, the converter 701 does not have a DC/DC conversion output. Straight bus bars 741, 742, and 743 may be connected to wires 711, 712, and 713, separately, for providing the AC voltage to a device (e.g., a three-phase induction or permanent magnet motor). As shown in FIG. 7, the wires 711, 712, and 713 are assembled on the same side of the board as the straight bars 741, 742, and 743. In other embodiments, the wires 711, 712, and 713 can be assembled on the opposite side of the board to the straight bars 741, 742, and 743.

In some embodiments, multiple converter modules may be chained together to provide a greater number of outputs. For example, a first converter may be connected to a second converter via extended bus bars or external parallel cabling to provide twice the amount of current sourcing capacity or to provide an extended number of converter legs/phases for specialized applications than if a single converter is used. In some implementations, a first rail and second rail of one module may be connected to a first and second rail of another module using bus bars to couple the DC inputs together for DC paralleling or to provide potential redundancy or efficiency gains. For example, by allowing for converters to share heat load or provide failure redundancy for each other, or to allow for an unused "hot spare" converter to be placed in high reliability applications when the converter outputs are also paralleled. Alternatively, by allowing two or more coupled gensets sourcing DC power on to the DC input bus to provide redundant alternative sources of power for converter use in case of a failure of a genset. In addition, genset wear leveling, efficiency matching to load demand, battery input, or input of renewable power sources (such as photovoltaic, fuel cell, wind, hydro, waste heat recovery, etc.) may also be accomplished in DC paralleling operation. In some embodiments, the modules may be similar in nature (e.g., have the same number and/or type of outputs), and coupling the modules may result in an increased number of same types of outputs. In some embodiments, the modules may have different configurations, such that one module may provide a first set of outputs and another module may provide a second set of outputs that different from the first set (e.g., the first module may provide DC outputs and the second module may provide AC outputs, etc.). Any number of modules may be coupled together in various implementations.

Figure 8:
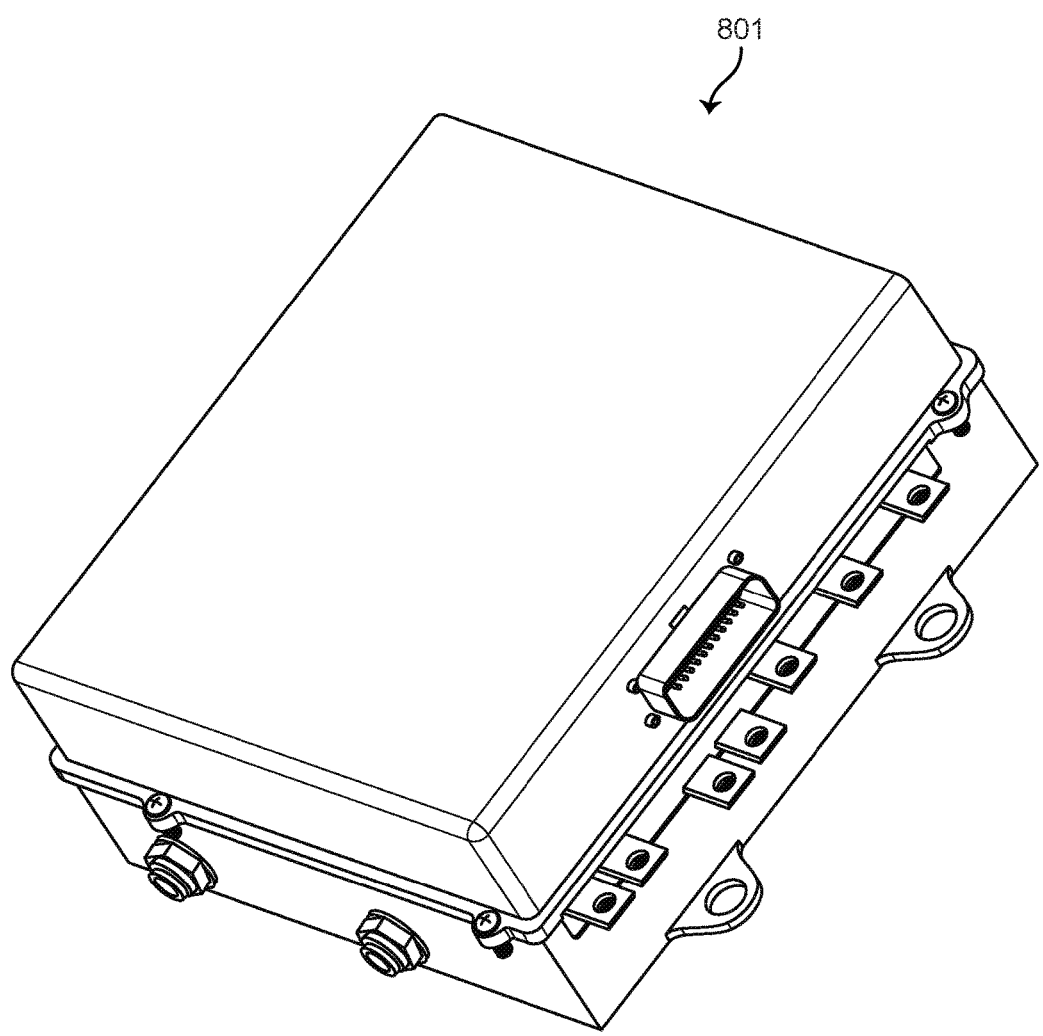
FIG. 8 is a perspective diagram of a reconfigurable converter system packaged in a box.

With reference to FIG. 8, a prospective diagram of a reconfigurable converter packaged in a box 801 is shown according to an embodiment. In some embodiments, box 801 further houses a CTRL/Driver board 211. CTRL/Drive board 211 may be a printed circuit board (PCB) including control module that controls the on/off of the switches on the legs. In some embodiments, box 801 further houses sensors including, for example, alternate current (AC) sensors, DC current sensors, and temperature sensors, connecting interfaces for the sensors, and overcurrent protection circuits. It shall be appreciated that box 801 may include fewer, more, or different connectors, sensors, and circuits than those listed here.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in machine-readable medium for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in machine-readable medium (or computer-readable medium), the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory ("RAM"), a read-only memory ("ROM"), an erasable programmable read-only memory (EPROM or Flash memory), a portable compact disc read-only memory ("CD-ROM"), a digital versatile disc ("DVD"), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A reconfigurable converter, comprising:
a first rail and a second rail that transmit a direct current (DC) power signal;
a plurality of legs connected in parallel between the first rail and the second rail, each of the plurality of legs including:
a first switch and a second switch connected in series between the first rail and the second rail; and
an output node between the first switch and the second switch; and
at least one coupling device providing a first output configuration and a second output configuration for at least two output nodes on the plurality of legs, wherein, in the first output configuration, the at least one coupling device comprises a coupling portion coupling the at least two output nodes to provide a common output terminal, and wherein, in the second output configuration, the at least one coupling device comprises separate output terminals, each connected to one of the at least two output nodes.

2. The reconfigurable converter of claim 1, wherein the plurality of legs comprise a first leg, a second leg, a third leg, a fourth leg, a fifth leg, a sixth leg, a seventh leg, and an eighth leg.

3. The reconfigurable converter of claim 2, wherein the at least one coupling device places the output nodes on the first leg, the second leg, the third leg, the fourth leg, the fifth leg, the sixth leg, the seventh leg, and the eighth leg in the second output configuration, and wherein the output terminals of each leg are configured for coupling to a four-phase switched reluctance machine.

4. The reconfigurable converter of claim 2, wherein the at least one coupling device places the output nodes on the first leg, the second leg, the third leg, the fourth leg, the fifth leg, and the sixth leg in the second output configuration, and wherein the output terminals of the first leg, the second leg, the third leg, the fourth leg, the fifth leg, and the sixth leg are each configured for coupling to a three-phase switched reluctance machine.

5. The reconfigurable converter of claim 2, wherein the at least one coupling device further places the output nodes on one or more legs in the second output configuration, and wherein the output terminals of each of the one or more legs are configured for coupling to a DC load.

6. The reconfigurable converter of claim 2, wherein the at least one coupling device places the output nodes on the first leg, the second leg, the third leg, the fourth leg, the fifth leg, and the sixth leg in the second output configuration, and wherein the output terminals of the first leg, the second leg, the third leg, the fourth leg, the fifth leg, and the sixth leg are each configured for coupling to one of a first three-phase output and a second three-phase output or a first two-phase output and a second two-phase output.

7. The reconfigurable converter of claim 6, wherein the first three-phase output and second three-phase output are each configured for coupling to one of a first three-phase motor and a second three-phase motor.

8. The reconfigurable converter of claim 2, wherein the at least one coupling device places the output nodes on the first leg and the second leg in the first output configuration, the output nodes on the third leg and the fourth leg in the first output configuration, and the output nodes on the fifth leg and the sixth leg in the first output configuration, and wherein the output terminals of the first leg and the second leg, the third leg and the fourth leg, and the fifth leg and the sixth leg are each configured for coupling to a three-phase motor.

9. The reconfigurable converter of claim 1, wherein the converter is coupled to one of a synchronous or variable speed genset.

10. A converter system, comprising:
a reconfigurable converter, including:
a first rail and a second rail that transmit a direct current (DC) power signal; and
a plurality of legs connected in parallel between the first rail and the second rail, each of the plurality of legs including:
a first switch and a second switch connected in series between the first rail and the second DC rail; and
an output node between the first switch and the second switch; and
bus bars providing a first output configuration and a second output configuration for at least two output nodes on the plurality of legs, wherein, in the first configuration, the bus bars comprise a first bus bar coupling the at least two output nodes to provide a common output terminal, and wherein, in the second output configuration, the bus bars comprise second bus bars, each connected to one of the at least two output nodes to provide separate output terminals.

11. The converter system of claim 10, further comprising a current sensor coupled to at least one of the bus bars.

12. The converter system of claim 10, wherein the first bus bar comprises a multi-tooth fork bar.

13. The converter system of claim 10, wherein the first bus bar comprises at least one of a T-shape bus bar or a U-shape bus bar, and wherein the second bus bars comprise straight bus bars.

14. The converter system of claim 10, where the multiple legs comprises a first leg, a second leg, a third leg, a fourth leg, a fifth leg, a sixth leg, a seventh leg, and an eighth leg.

15. The converter system of claim 14, wherein the second bus bars place the output nodes on the first leg, the second leg, the third leg, the fourth leg, the fifth leg, the sixth leg, the seventh leg, and the eighth leg in the second output configuration, and the output terminals of each leg are configured for coupling to a four-phase switched reluctance machine.

16. The converter system of claim 14, wherein the second bus bars place the output nodes the first leg, the second leg, the third leg, the fourth leg, the fifth leg, and the sixth leg in the second output configuration, and wherein the output terminals of the first leg, the second leg, the third leg, the fourth leg, the fifth leg, and the sixth leg are each configured for coupling to a three-phase switched reluctance machine.

17. The converter system of claim 14, wherein the second bus bar and the third bus bar place the output nodes on the seventh leg and the eighth leg in the second configuration, and wherein the output terminals of the seventh leg and the eighth leg are each configured for coupling to a DC load.

18. The converter system of claim 14, wherein the second bus bars place the output nodes on the first leg, the second leg, the third leg, the fourth leg, the fifth leg, and the sixth leg in the second configuration, and wherein the output terminals of the first leg, the second leg, the third leg, the fourth leg, the fifth leg, and the sixth leg are each configured for coupling to one of a first three-phase motor and a second three-phase motor.

19. The converter system of claim 14, wherein the first bus bars place the output nodes on the first leg and the second leg in the first output configuration, the output nodes on the third leg and the fourth leg in the first output configuration, and the output nodes on the fifth leg and the sixth leg in the first output configuration, and wherein the output terminals of the first leg and the second leg, the third leg and the fourth leg, and the fifth leg and the sixth leg are each configured for coupling to a three-phase motor.

20. A reconfigurable converter, comprising:
a power circuit receives a direct current (DC) power signal and provides an alternating current (AC) output signal across at least three phases, wherein the power circuit comprises a plurality of legs, and wherein each leg comprises an output node;
at least one coupling device providing a first output configuration and a second output configuration for at least two output nodes on the plurality of legs, wherein, in the first output configuration, the at least one coupling device comprises a coupling portion coupling the at least two output nodes to provide a common output terminal, and wherein, in the second output configuration, the at least one coupling device comprises separate output terminals, each connected to one of the at least two output nodes.

21. The reconfigurable converter of claim 20, wherein the plurality of legs comprise a first leg, a second leg, a third leg, a fourth leg, a fifth leg, a sixth leg, a seventh leg, and an eighth leg.

22. The reconfigurable converter of claim 21, wherein the at least one coupling device place the output nodes on the first leg, the second leg, the third leg, the fourth leg, the fifth leg, the sixth leg, the seventh leg, and the eighth leg in the second output configuration.

23. The reconfigurable converter of claim 20, wherein the at least one coupling device places the output nodes on the first leg and the second leg in the first output configuration, the output nodes on the third leg and the fourth leg in the first output configuration, the output nodes on the fifth leg and the sixth leg in the first output configuration, and the output nodes on the seventh leg and the eighth leg in the second configuration.

* * * * *